United States Patent
Hashimoto

(10) Patent No.: US 9,437,765 B2
(45) Date of Patent: Sep. 6, 2016

(54) SOLAR CELL MODULE AND SOLAR CELL MODULE MANUFACTURING METHOD

(71) Applicant: Panasonic Intellectual Property Management Co., Ltd., Osaka (JP)

(72) Inventor: Haruhisa Hashimoto, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/866,663

(22) Filed: Sep. 25, 2015

(65) Prior Publication Data

US 2016/0020349 A1    Jan. 21, 2016

Related U.S. Application Data

(63) Continuation of application No. PCT/JP2013/002126, filed on Mar. 28, 2013.

(51) Int. Cl.
*H01L 31/05* (2014.01)
*H01L 31/18* (2006.01)

(52) U.S. Cl.
CPC ....... *H01L 31/0504* (2013.01); *H01L 31/0508* (2013.01); *H01L 31/0512* (2013.01); *H01L 31/1876* (2013.01); *Y02E 10/50* (2013.01)

(58) Field of Classification Search
CPC .............. H01L 31/05; H01L 31/0504; H01L 31/0508; H01L 31/0512; H01L 31/1876; H01L 31/1884
USPC ................................................. 136/252, 256
See application file for complete search history.

(56) References Cited

U.S. PATENT DOCUMENTS

| | | | |
|---|---|---|---|
| 2010/0126551 | A1 | 5/2010 | Okamoto et al. |
| 2011/0223394 | A1* | 9/2011 | Daigaku ................ C09J 7/0217 428/195.1 |
| 2012/0031457 | A1 | 2/2012 | Taira et al. |
| 2012/0305047 | A1 | 12/2012 | Taira et al. |

FOREIGN PATENT DOCUMENTS

| | | |
|---|---|---|
| JP | 4-44166 U | 4/1992 |
| JP | 2004-253475 A | 9/2004 |
| JP | 2009-212396 A | 9/2009 |

OTHER PUBLICATIONS

International Search Report PCT/JP2013/002126 dated Jul. 9, 2013 with English translation.

* cited by examiner

*Primary Examiner* — Susan D Leong
(74) *Attorney, Agent, or Firm* — McDermott Will & Emery LLP

(57) ABSTRACT

A solar cell module includes: a plurality of solar cell elements that have electrodes on surfaces thereof; a tab wire that connects the electrodes of the plurality of solar cell elements; and a resin portion that is provided in a discontinuous manner on the surfaces and that bonds the tab wire and the surfaces to each other. The tab wire extends in a predetermined direction along the electrodes, and the resin portion is discontinuously arranged along the tab wire. A bus bar electrode extends in a non-linear shape. The bus bar electrode is provided such that the bus bar electrode passes a plurality of vertices that are each positioned spaced apart in a short-side direction of the bus bar electrode from a center position of the bus bar electrode in the short-side direction. The resin portion is provided avoiding the vicinity of the vertices.

5 Claims, 19 Drawing Sheets

SOLAR CELL MODULE AND SOLAR CELL MODULE MANUFACTURING METHOD

CROSS-REFERENCE TO RELATED APPLICATIONS

This application is a Continuation Application of PCT/JP2013/002126 filed Mar. 28, 2013, the subject matter of which is incorporated herein by reference in entirety.

BACKGROUND

1. Field of the Invention

The present invention relates to a solar cell module and a solar cell module manufacturing method.

2. Description of the Related Art

A solar cell module has a plurality of solar cells. The plurality of solar cells has electrodes on the surfaces thereof. The respective electrodes of the plurality of solar cells are connected to one another by wiring members. The wiring members are bonded by, for example, adhesives made of resins such that the wiring members are connected conductively to the respective electrodes of the solar cells.

The solar cells have a thermal expansion coefficient that is different from that of the wiring members. Therefore, when the temperature of the solar cell module changes due to an installation environment, stress is produced between the solar cells and the wiring members. As a result, the wiring members may peel off.

SUMMARY

In this background, a purpose of the present invention is to provide a technology for improving the reliability of a solar cell module.

A solar cell module according to one embodiment of the present invention includes: a plurality of solar cell elements that have electrodes on surfaces thereof; a tab wire that connects the electrodes of the plurality of solar cell elements; and a resin portion that is provided in a discontinuous manner on the surfaces and that bonds the tab wire and the surfaces to each other.

Another embodiment of the present invention relates to a solar cell module manufacturing method. This method includes: preparing a plurality of solar cell elements that have electrodes on surfaces thereof and a tab wire that connects the plurality of solar cell elements with one another; arranging an adhesive in a discontinuous manner on the surfaces, and arranging the tab wire on the adhesive.

BRIEF DESCRIPTION OF THE DRAWINGS

Embodiments will now be described, by way of example only, with reference to the accompanying drawings that are meant to be exemplary, not limiting, and wherein like elements are numbered alike in several figures, in which.

The figures depict one or more implementations in accordance with the present teaching, by way of example only, not by way of limitations. In the figures, like reference numerals refer to the same or similar elements.

DETAILED DESCRIPTION

The invention will now be described by reference to the preferred embodiments. This does not intend to limit the scope of the present invention, but to exemplify the invention.

Hereinafter, an example embodiment for carrying out the present invention will be described in detail with reference to the accompanying drawing. In the explanation of the figures, like numerals represent like constituting elements, and duplicative explanations will be omitted appropriately.

A brief description is now given before focusing on specific features of the present embodiment. The present embodiment relates to a technology for bonding a tab wire that connects a plurality of solar cell elements constituting a solar cell module to surfaces of the solar cell elements. In recent years, a tab wire is often bonded by using a resin adhesive for the purpose of cost reduction. If the resin adhesive is provided without any space between the tab wire and the surfaces of the solar cell elements in order to increase the bonding strength of the tab wire at this time, large stress is applied to the solar cell elements due to a difference in thermal expansion coefficient between the tab wire and the solar cell elements. Thus, in the present embodiment, the stress applied to the solar cell elements is mitigated by providing the resin adhesive for bonding the tab wire in a discontinuous manner, and the reliability of the solar cell module is thereby increased.

Figure 1:
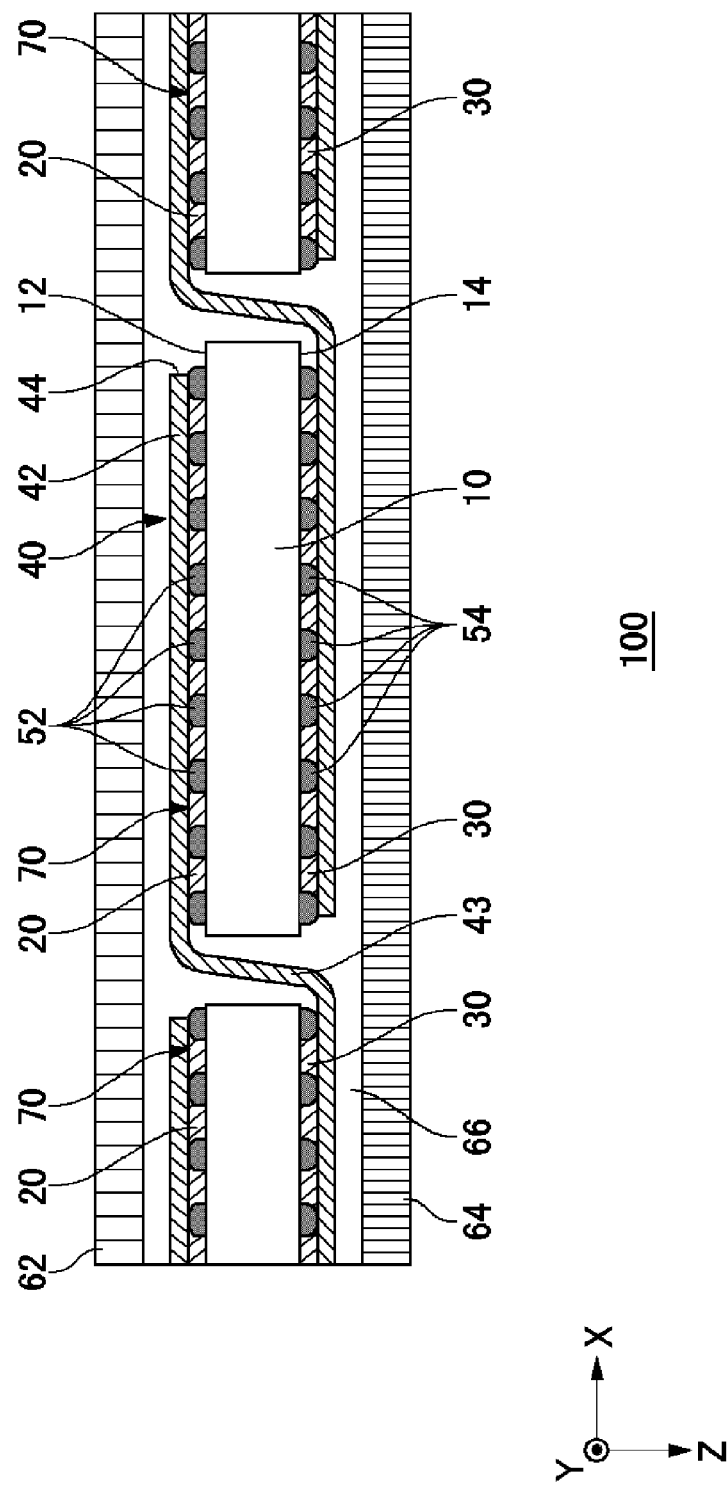
FIG. 1 is a cross-sectional view illustrating a solar cell module according to an embodiment.

FIG. 1 is a cross-sectional view illustrating a solar cell module 100 according to the embodiment.

The solar cell module 100 according to the embodiment is provided with a plurality of solar cell elements 70, a tab wire 40 connecting adjacent solar cell elements 70 with each other, a first resin portion 52, a second resin portion 54, a protection substrate 62, a back sheet 64, and a sealing layer 66. In the following, the respective configurations thereof will be described in detail in order.

A solar cell element 70 is provided with an electricity generation layer 10, a first electrode 20, and a second electrode 30.

The electricity generation layer 10 is a layer that absorbs incident light so as to generate photovoltaic power and has a substrate made of a semiconductor material, for example, crystalline silicon, gallium arsenide (GaAs), indium phosphide (InP), or the like. The structure of the electricity generation layer 10 is not particularly limited. In the present embodiment, the electricity generation layer 10 has a heterojunction between an n-type monocrystalline silicon substrate and non-crystalline silicon. In the electricity generation layer 10, for example, an i-type non-crystalline silicon layer, a p-type non-crystalline silicon layer on which boron (B) or the like is doped, and a transparent conductive layer made of a translucent conductive oxide such as an indium oxide are layered in said order on the side of a light-receiving surface of the n-type monocrystalline silicon substrate. An i-type non-crystalline silicon layer, an n-type non-crystalline silicon layer on which phosphorous (P) or the like is doped, and a transparent conductive layer are layered in said order on the side of a back surface of the substrate.

The electricity generation layer 10 has a light-receiving surface 12, which is one surface of the solar cell element 70, and a back surface 14, which is one surface of the solar cell element 70 and is opposed to the light-receiving surface 12 at the back. The light-receiving surface means a principal surface on which sunlight mainly becomes incident in the solar cell element 70 and a surface on which the major portion of light that enters the electricity generation layer 10 becomes incident.

The first electrode 20 and the second electrode 30 are electrodes that are each provided on a surface of the solar cell element 70 and that take out electricity generated by the electricity generation layer 10 to the outside. The first electrode 20 is provided on the light-receiving surface 12, and the second electrode 30 is provided on the back surface 14. The first electrode 20 and the second electrode 30 are conductive materials containing, for example, silver (Ag), copper (Cu), or the like. The first electrode 20 and the second electrode 30 may further contain an electrolytic plating layer of copper (Cu), tin (Sn), or the like. However, the examples given are non-limiting. Other metals such as gold (Au) and the like, other conductive materials, or a combination of those may be used.

The tab wire 40 is bonded by the first resin portion 52 on a surface such that the tab wire 40 is connected electrically and conductively to the first electrode 20. The tab wire 40 is bonded by the second resin portion 54 on a surface such that the tab wire 40 is connected electrically and conductively to the second electrode 30. The tab wire 40 is an elongated metallic foil, and, for example, a copper foil coated with silver or an aluminum foil is used. The tab wire 40 extends in a first direction (x direction) in which the plurality of solar cell elements 70 are arranged and is connected to a first electrode 20 of one solar cell element 70 that is adjacent in the x direction and to a second electrode 30 of the other solar cell element 70.

The tab wire 40 is provided with an extension portion 42, a bent portion 43, and a tip portion 44.

The extension portion 42 extends in the x direction along the light-receiving surface 12 or the back surface 14. The extension portion 42 is bonded to the light-receiving surface 12 via the first resin portion 52 and to the back surface 14 via the second resin portion 54. More specifically, the extension portion 42 is arranged on the first electrode 20 or the second electrode 30 and bonded in a state where the extension portion 42 is directly in contact with at least a portion of the electrode such that the extension portion 42 becomes electrically and conductively connected to the electrode.

The tip portion 44 is provided on the light-receiving surface 12 or the back surface 14 on which the extension portion 42 is provided and is arranged in an area that is close to the outer periphery of the solar cell element 70.

The bent portion 43 has a step that corresponds to the thickness of the solar cell element 70. The provision of the bent portion 43 allows the tab wire 40 to connect a light-receiving surface 12 of one solar cell element 70 to a back surface 14 of the other solar cell element 70 while being in a state where the respective light-receiving surfaces 12 and the respective back surfaces 14 of the plurality of solar cell elements 70 are each arranged in the same plane.

The protection substrate 62 and the back sheet 64 protect the solar cell element 70 from the external environment. The protection substrate 62 that is provided on the side of the light-receiving surface 12 transmits light having a wavelength band that is absorbed by the solar cell element 70 for the generation of electricity. The protection substrate 62 is, for example, a glass substrate. The back sheet 64 provided on the side of the back surface 14 is a resin substrate of EVA, polyimides, or the like or a glass substrate as in the case of the protection substrate 62.

The sealing layer 66 is a resin material such as ethylene-vinyl acetate copolymers (EVA), polyvinyl butyral (PVB), polyamides, or the like. This prevents, e.g., the infiltration of moisture to the solar cell element 70 and also improves the overall strength of the solar cell module 100. Also, by providing a metallic foil or the like between the back sheet 64 and the sealing layer 66 so that a lot of light entering from the side of the protection substrate 62 is absorbed by the solar cell element 70, light that reaches the back sheet 64 after passing through the solar cell element 70 may be reflected to the solar cell element 70.

The configuration of the first electrode 20 and the configuration of the second electrode 30 will be described in detail with reference to FIGS. 2 and 3.

Figure 2:
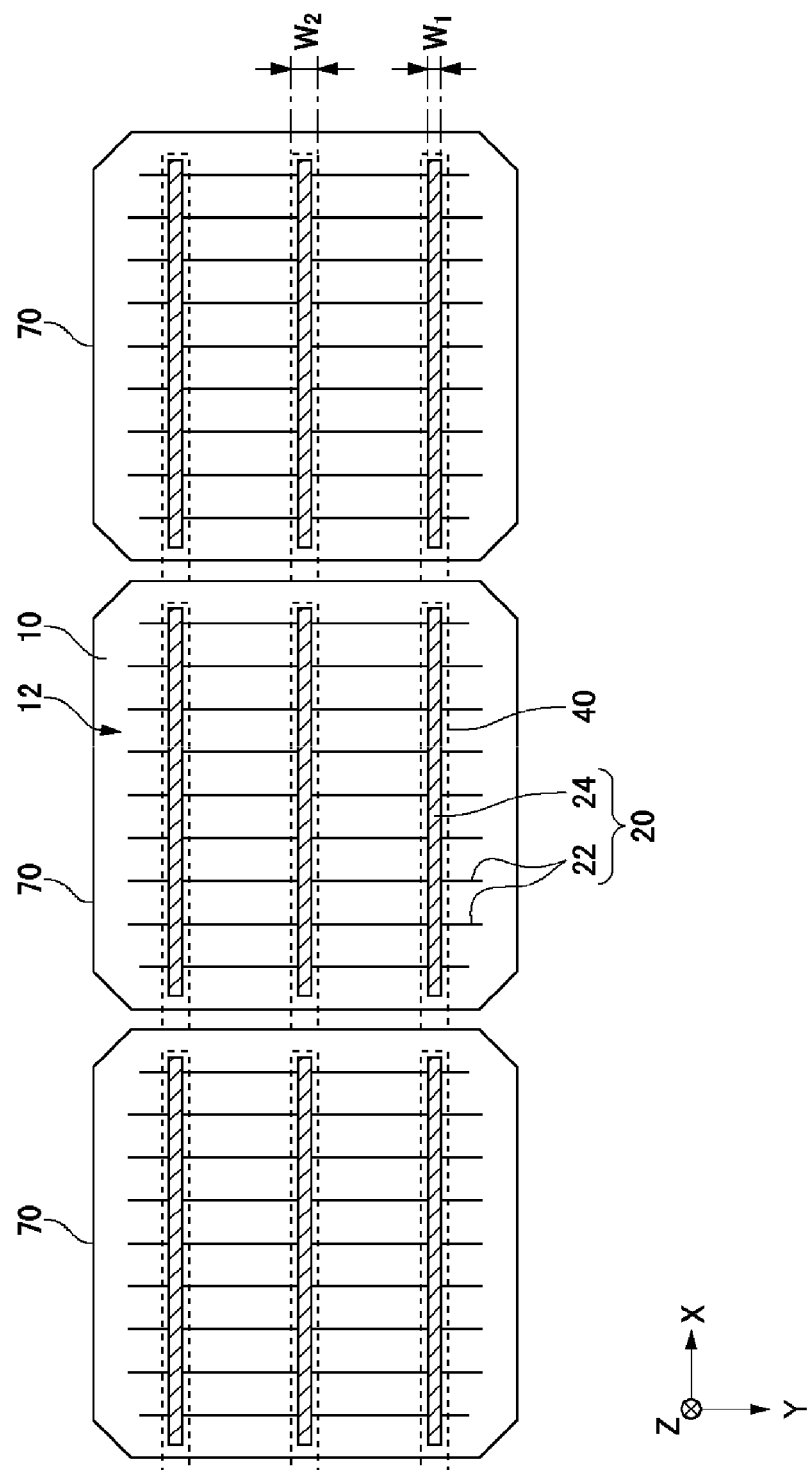
FIG. 2 is an exterior view illustrating a light-receiving surface of a solar cell element according to the embodiment.

FIG. 2 is an exterior view illustrating the light-receiving surface 12 of the solar cell element 70. In the figure, an area in which the tab wire 40 is arranged is indicated by a dashed line.

The first electrode 20 is provided with three bus bar electrodes 24 extending parallel to one another in the x direction and a plurality of finger electrodes 22 extending perpendicularly to the bus bar electrodes 24 in a second direction (y direction). The finger electrodes 22 are formed on the light-receiving surface 12. Thus, the finger electrodes 22 are desirably formed thinly so that light entering the electricity generation layer 10 is not blocked. Also, the finger electrodes 22 are desirably arranged at a predetermined interval so as to be able to efficiently collect electricity that has been generated.

The bus bar electrodes 24 connect the plurality of finger electrodes 22 with one another and extend linearly in the x direction. The bus bar electrodes 24 are desirably formed thin enough not to block light entering the electricity generation layer 10 and thick enough to allow the electricity collected from the plurality of finger electrodes 22 to flow efficiently. In the present embodiment, the width $w_1$ of the bus bar electrodes 24 in the y direction is formed to be narrower than the width $w_2$ of the tab wire 40.

Figure 3:
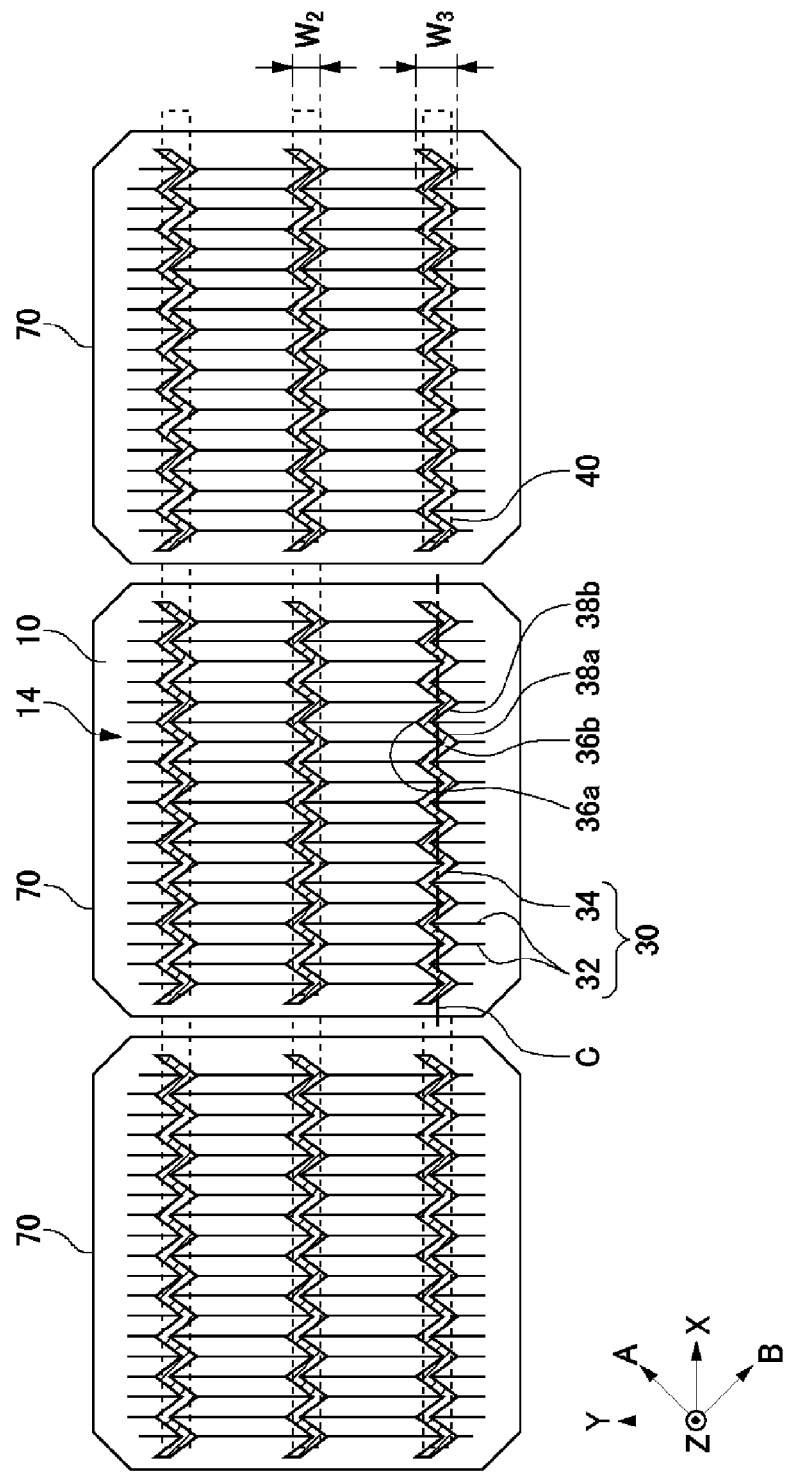
FIG. 3 is an exterior view illustrating a back surface of the solar cell element according to the embodiment.

FIG. 3 is an exterior view illustrating the back surface 14 of the solar cell element 70. In the figure, an area in which the tab wire 40 is arranged is also indicated by a dashed line. For the sake of ease of explanation, a description is omitted regarding a partial area in which the tab wire 40 is arranged.

In the same way as in the first electrode 20, the second electrode 30 is also provided with three bus bar electrodes 34 extending parallel to one another in the x direction and a plurality of finger electrodes 32 extending perpendicularly to the bus bar electrodes 34 in the y direction. On the other hand, the second electrode 30 is different from the first electrode 20 in that the second electrode 30 is provided with the bus bar electrodes 34 that are formed in a non-linear shape. More specifically, the bus bar electrodes 34 are formed in a zigzag shape. Since the back surface 14 is not a principle surface on which sunlight mainly becomes incident, the number of the finger electrodes 32 provided on the back surface 14 is larger than the number of the finger electrodes 22 on the light-receiving surface 12, and the electricity collection efficiency is higher than that of the finger electrodes 22.

The bus bar electrodes 34 on the back surface 14 are formed in a zigzag shape such that the bus bar electrodes 34 repeatedly cross a center line C that extends in the x direction in such a manner that the center line C connects center positions in the y direction, which is a short-side direction. In the present embodiment, a range $w_3$ in the y direction in which the bus bar electrodes 34 are formed is formed to be larger than the width $w_2$ of the tab wire 40.

A bus bar electrode 34 is provided with a plurality of first vertices 36a, a plurality of second vertices 36b, a plurality of first connection electrodes 38a, and a plurality of second connection electrodes 38b.

The first vertices 36a and the second vertices 36b (hereinafter, also referred to as vertices 36 generically) are bent portions where a direction in which the bus bar electrode 34 having a zigzag shape extends changes and are each provided at a position spaced apart from the center line C of the bus bar electrode 34. The first vertices 36a are provided, being spaced apart in a +y direction (the upward direction on paper) with respect to the center line C, and the second vertices 36b are provided, being spaced apart in a −y direction (the downward direction on paper) with respect to the center line C. A first vertex 36a and a second vertex 36b that are adjacent to each other are connected by a first connection electrode 38a or a second connection electrode 38b. In the present embodiment, the vertices 36 are provided at the respective positions of the finger electrodes 32. However, in an exemplary variation, the vertices 36 may be provided at positions that are different from the respective positions of the finger electrodes 32.

The first connection electrodes 38a and the second connection electrodes 38b each extend in a direction in which the first connection electrodes 38a and the second connection electrodes 38b each intersect diagonally with the center line C, and connect a first vertex 36a and a second vertex 36b that are adjacent to each other. The first connection electrodes 38a extend in a direction between a +x direction and the +y direction from the respective second vertices 36b toward the respective first vertices 36a (in a right diagonally upward direction A on paper). On the other hand, the second connection electrodes 38b extend in a direction between the +x direction and the −y direction from the respective first vertices 36a toward the respective second vertices 36b (in a right diagonally downward direction B on paper). The first connection electrodes 38a extending in the right diagonally upward direction A and the second connection electrodes 38b extending in the right diagonally downward direction B are provided alternately, and the bus bar electrodes 34 are thereby formed in a zigzag shape.

The configuration of a first resin portion 52 will be described in detail with reference to FIGS. 4 through 6.

Figure 4:
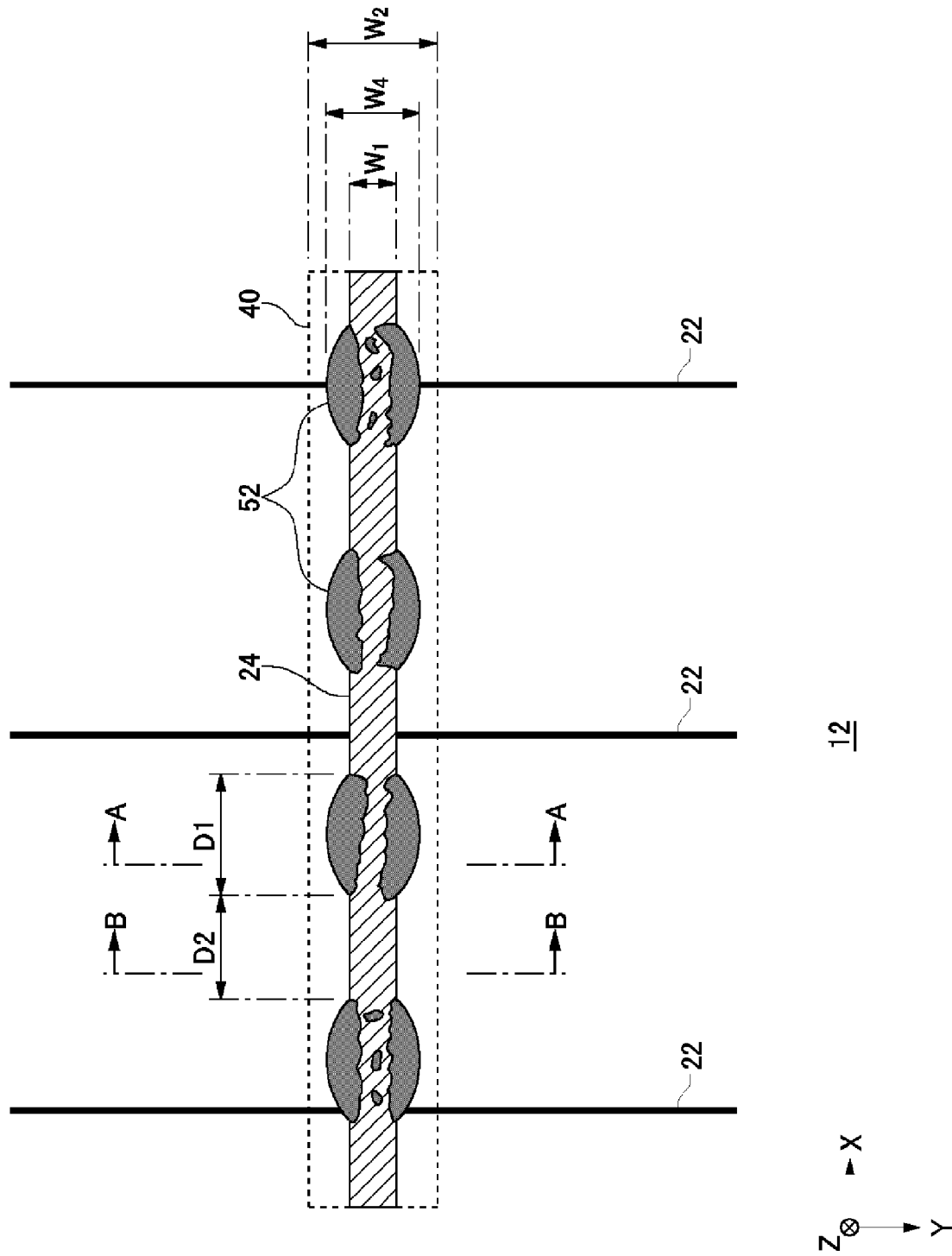
FIG. 4 is an exterior view illustrating a first resin portion that is provided on the light-receiving surface according to the embodiment.

FIG. 4 is an exterior view illustrating a first resin portion 52 provided on the light-receiving surface 12. Also in the figure, a description is omitted regarding the tab wire 40 that is provided on the light-receiving surface 12, and a position at which the tab wire 40 is provided is indicated by a dashed line.

The first resin portion 52 is provided on the light-receiving surface 12 and bonds the light-receiving surface 12 and the tab wire 40 extending on the light-receiving surface 12 together. The first resin portion 52 is an adhesive layer in which a resin adhesive is hardened, and, for example, a thermosetting resin material such as an epoxy resin, an acrylic resin, a urethane resin, or the like is used. In the present embodiment, an insulating resin material is used as the first resin portion 52. By dispersing conductive particles or the like in the resin material, the resin material may be designed to have conductivity.

The first resin portion 52 is provided in contact with a bus bar electrode 24 extending in the x direction and is provided such that the width $w_4$ thereof in the y direction is wider than the width $w_1$ of the bus bar electrode 24 and is narrower than the width $w_2$ of the tab wire 40. The first resin portion 52 is provided discretely in a discontinuous manner in the x direction, and an adhesion area D1 in which the first resin portion 52 is provided and a non-adhesion area D2 in which the first resin portion 52 is not provided are alternately arranged in the x direction.

Figure 5:
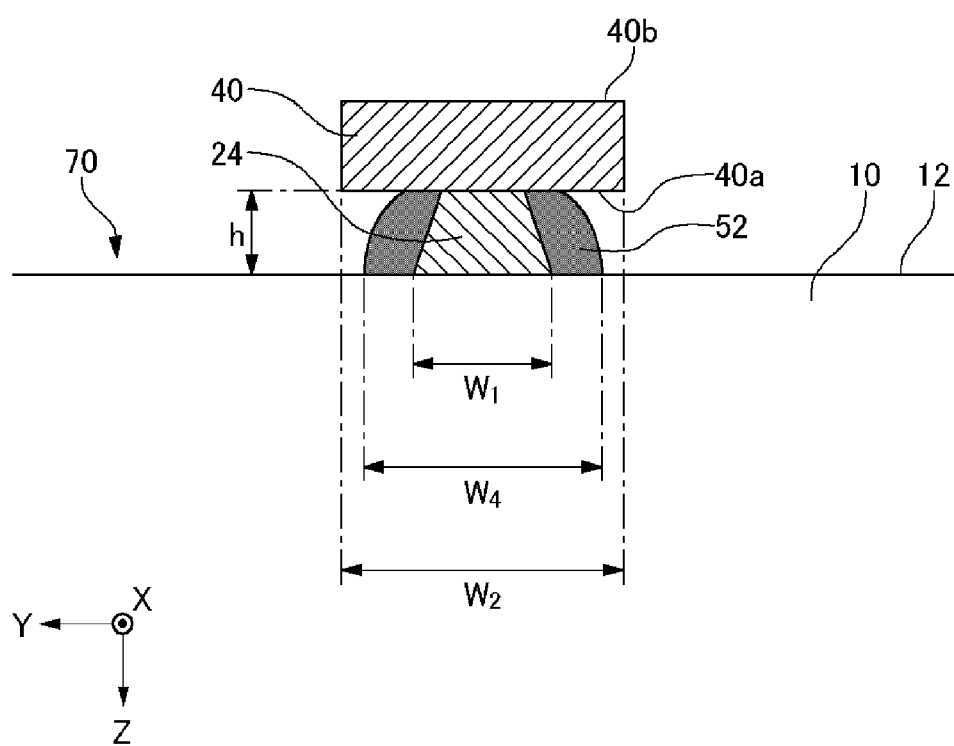
FIG. 5 is a cross-sectional view illustrating a structure of an adhesion area of the light-receiving surface according to the embodiment.

FIG. 5 is a cross-sectional view illustrating the structure of an adhesion area D1 on the light-receiving surface 12 and illustrates an A-A cross-section line in FIG. 4.

The first resin portion 52 is provided around the bus bar electrode 24 in the adhesion area D1 and is provided such that the thickness h thereof from the light-receiving surface 12 becomes equal to the thickness of the bus bar electrode 24. The first resin portion 52 bonds the tab wire 40 and the light-receiving surface 12 of the electricity generation layer 10 together by being in contact with at least a portion of a lower surface 40a of the tab wire 40. The lower surface 40a of the tab wire 40 becomes conductively connected by being directly in contact with the bus bar electrode 24.

Figure 6:
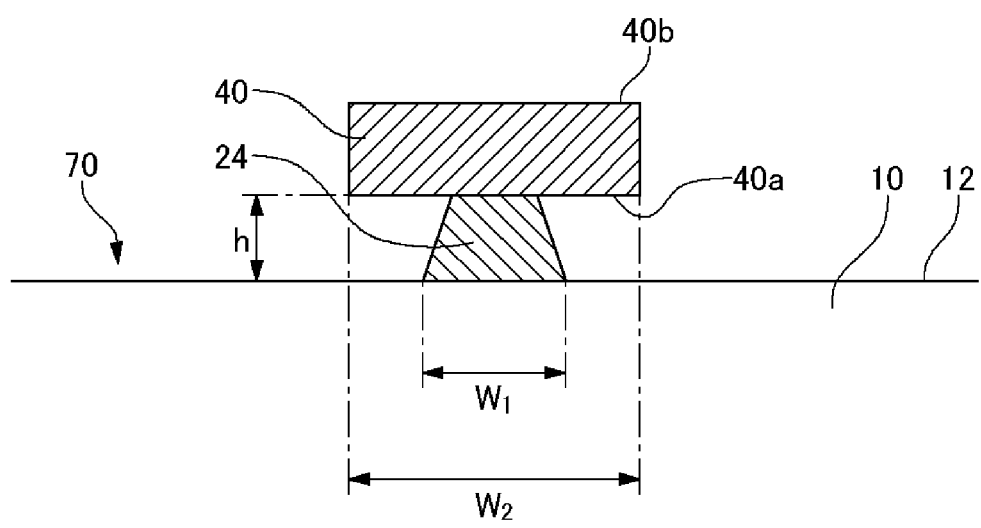
FIG. 6 is a cross-sectional view illustrating a structure of a non-adhesion area of the light-receiving surface according to the embodiment.

FIG. 6 is a cross-sectional view illustrating the structure of a non-adhesion area D2 on the light-receiving surface 12 and illustrates a B-B cross-section line in FIG. 4.

Although a first resin portion 52 is not provided in the non-adhesion area D2, the tab wire 40 in the non-adhesion area D2 becomes conductively connected by the direct contact of the lower surface 40a thereof with the bus bar electrode 24. The tab wire 40 is bonded to the light-receiving surface 12 of the electricity generation layer 10 by the first resin portion 52 of the adhesion area D1 that is adjacent to the non-adhesion area D2. Thus, the tab wire 40 becomes in contact with the bus bar electrode 24 even in the non-adhesion area D2.

Figure 7:
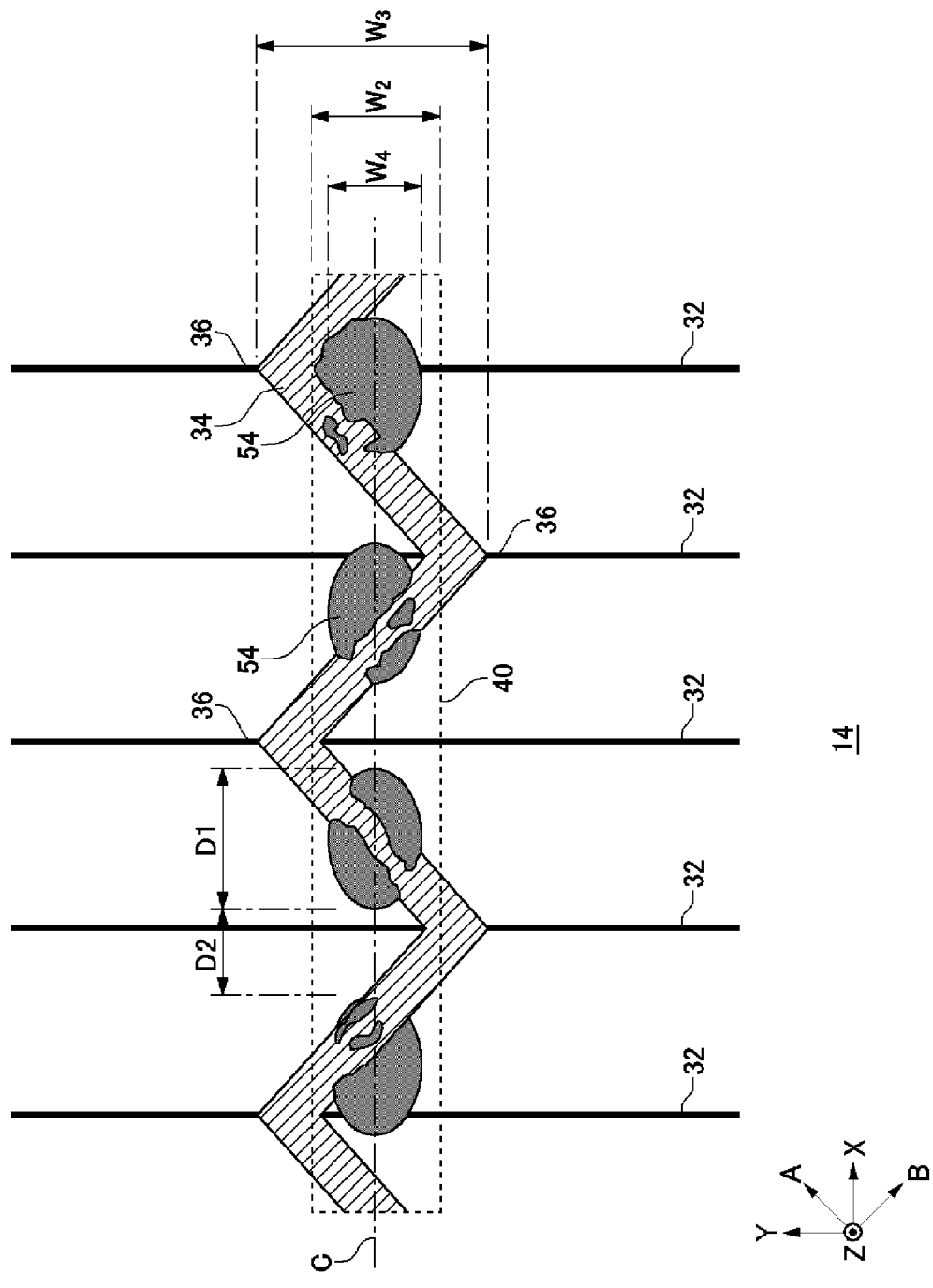
FIG. 7 is an exterior view illustrating a second resin portion that is provided on the back surface according to the embodiment.

The configuration of the second resin portion 54 will be described in detail with reference to FIG. 7. FIG. 7 is an exterior view illustrating the second resin portion provided on the back surface 14. In the figure, as in the case of FIG. 4, a description is omitted regarding a tab wire 40 that is provided on the back surface 14, and a position at which the tab wire 40 is provided is indicated by a dashed line.

The second resin portion 54 is provided on the back surface 14 and bonds the back surface 14 of the solar cell element 70 and the tab wire 40 extending on the solar cell element 70 together. As in the case of the first resin portion 52, the second resin portion 54 is an adhesive layer in which a resin adhesive is hardened and is, for example, an adhesive thermosetting resin material such as an epoxy resin, an acrylic resin, a urethane resin, or the like.

The second resin portion 54 is provided along the center line C of a bus bar electrode 34 extending in a zigzag shape and is provided such that the width $w_4$ thereof in the y direction is narrower than the width $w_2$ of the tab wire 40. The second resin portion 54 is provided discretely in a discontinuous manner in the x direction, and an adhesion area D1 in which the second resin portion 54 is provided and a non-adhesion area D2 in which the first resin portion 52 is not provided are alternately arranged in the x direction.

The second resin portion 54 is provided around the bus bar electrode 34 in the adhesion area D1 and is provided such that the thickness thereof from the back surface 14 becomes the thickness of the bus bar electrode 34. The second resin portion 54 bonds the tab wire 40 and the back surface 14 of the solar cell element 70 together by being in contact with at least a portion of the lower surface of the tab wire 40. The tab wire 40 becomes conductively connected by being directly in contact with the bus bar electrode 34.

With reference to FIGS. 8 through 12, an explanation will be given now regarding an example of the manufacturing method of the solar cell module 100. First, with reference to FIGS. 8 through 10, a description will be made in detail regarding a process of bonding the tab wire 40 to the light-receiving surface 12.

Figure 8:
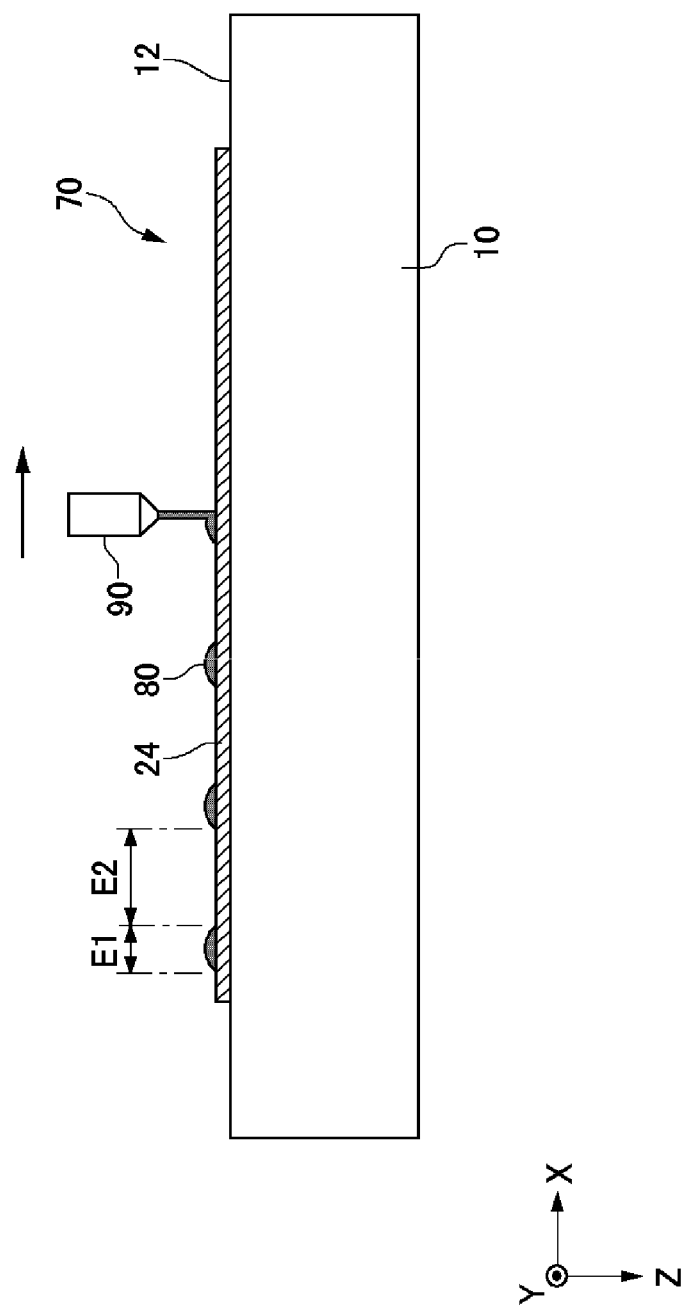
FIG. 8 is a diagram illustrating a process of applying an adhesive on the light-receiving surface of the solar cell element according to the embodiment.

FIG. 8 is a diagram illustrating a process of applying an adhesive 80 on the light-receiving surface 12 of the solar cell element 70.

A plurality of solar cell elements 70 are prepared, and an adhesive 80 for bonding the tab wire 40 is applied on a surface of a solar cell element 70. The adhesive 80 is a paste-like resin adhesive and has a thermosetting property. For example, a paste-like resin before hardening can be used by mixing a solid component into an epoxy resin to which a hardening agent is added.

The adhesive 80 is applied on a bus bar electrode 24 in a discontinuous manner in the x direction using a discharge means 90 such as a dispenser. The adhesive 80 is applied only to an application area E1 that corresponds to an adhesion area D1 while avoiding a non-application area E2 that corresponds to a non-adhesion area D2. This allows the adhesive 80 to be applied such that the application area E1 and the non-application area E2 are arranged alternately in the x direction.

The adhesive 80 may be applied by printing. For example, in the case of performing printing by intaglio offset printing, a printing plate on which a concave portion is provided in an area that corresponds to the application area E1 may be used. Alternatively, the printing may be performed by screen printing. In this case, the adhesive 80 may be applied repeatedly in layers according to the thickness of the adhesive 80 that is required.

Figure 9:
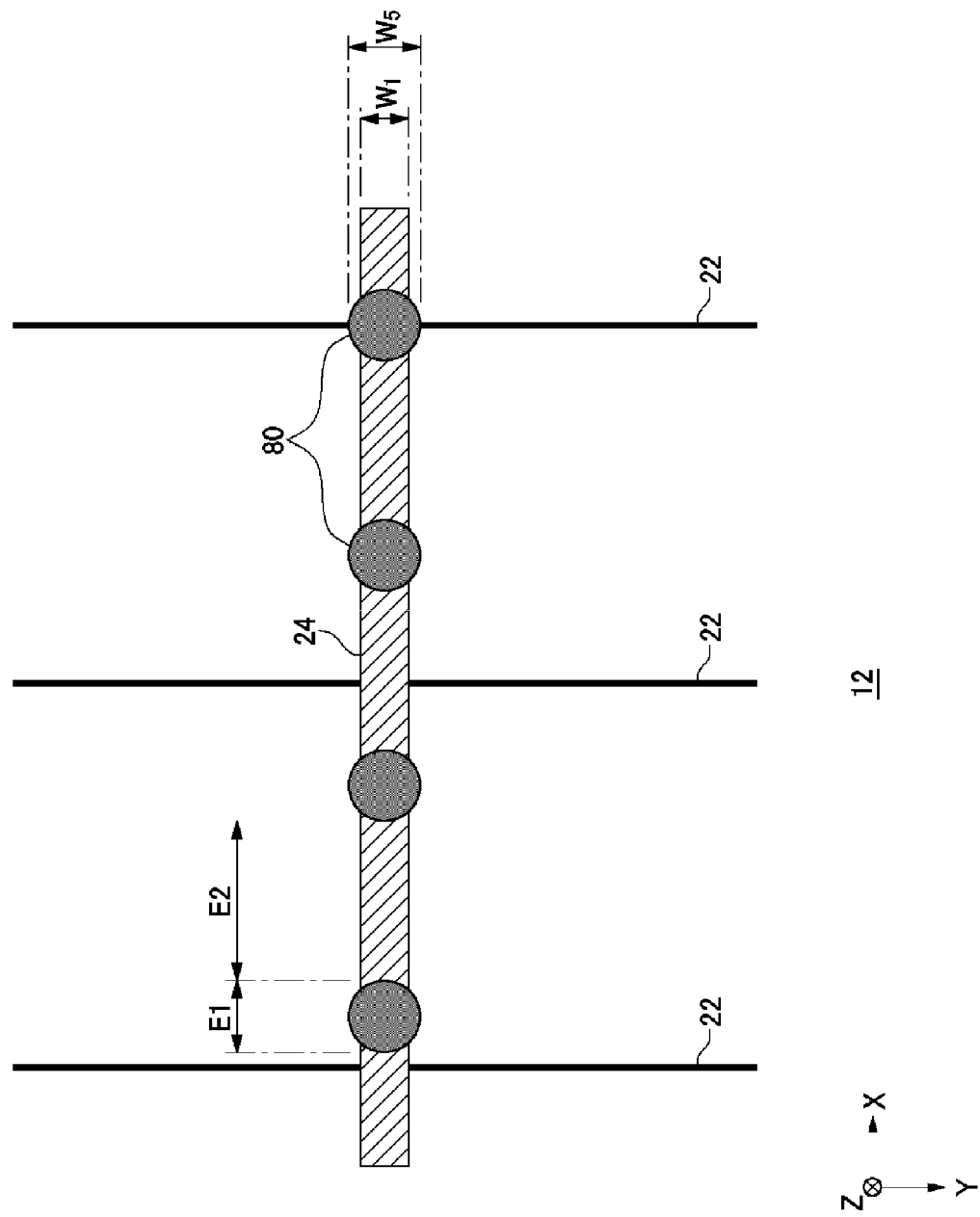
FIG. 9 is an exterior view illustrating the adhesive applied on light-receiving surface of the solar cell element according to the embodiment.

FIG. 9 is a diagram illustrating an adhesive 80 that is applied on the light-receiving surface 12 of the solar cell element.

The adhesive 80 is applied such that the width $w_5$ thereof in the y direction is nearly equal to or a little wider than the width $w_1$ of the bus bar electrode 24. This ensures the adhesive 80 to spread around the bus bar electrode 24 while preventing the adhesive 80 from spreading too much around the bus bar electrode 24, when the tab wire 40 is placed from above the adhesive 80. Thereby, a certain degree of bonding strength can be ensured, and a reduction in a light-receiving area caused due to the spreading of the fillet of the adhesive 80 can be prevented.

Figure 10:
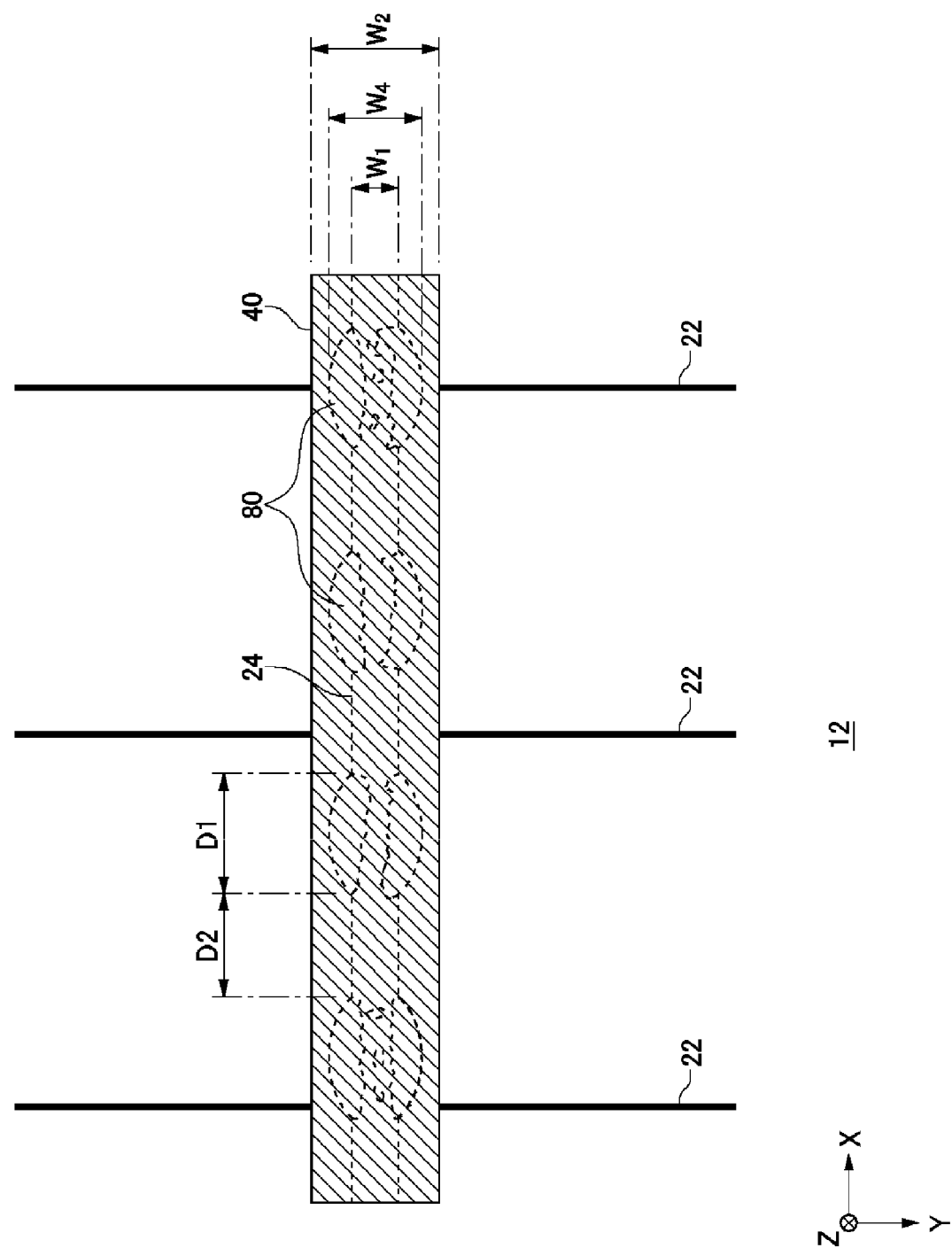
FIG. 10 is a diagram illustrating a tab wire that is bonded to the light-receiving surface of the solar cell element according to the embodiment.

FIG. 10 is a diagram illustrating a tab wire 40 that is bonded to the light-receiving surface 12 of the solar cell element and shows a state where the tab wire 40 is arranged on the adhesive 80 shown in FIG. 9.

The tab wire 40 is arranged on the adhesive 80 such that the longitudinal direction of the tab wire 40 is aligned with the x direction in which the adhesive 80 is discontinuously arranged, and the bus bar electrode 24 and the tab wire 40 are directly in contact with each other and become connected conductively. The pressing of the tab wire 40 makes the adhesive 80 to overflow around the bus bar electrode 24, and the light-receiving surface 12 and the tab wire 40 become bonded to each other by the adhesive 80 that has overflown.

Being pushed out by the tab wire 40, the adhesive 80 spreads, thereby forming the adhesion area D1 in which the tab wire 40 and the light-receiving surface 12 are bonded to each other. As a result, the range of the adhesion area D1 becomes wider than the application area E1, and the width $w_4$ of the adhesive 80 in the y direction after the tab wire 40 is bonded becomes wider than the width $w_5$ of the adhesive 80 at the time of the application. An area in which the adhesive 80 does not spread between the tab wire 40 and the light-receiving surface 12 is the non-adhesion area D2 in which the tab wire 40 and the light-receiving surface 12 do not become bonded to each other. In this manner, the adhesion area D1 is provided in a discontinuous manner. The non-adhesion area D2 becomes narrower than the non-application area E2 since the adhesion area D1 is formed wider than the application area E1.

By thermally hardening the adhesive 80 by heating the tab wire 40 in this state, a first resin portion 52 is formed in the adhesion area D1. In this manner, the first resin portion 52 is provided in a discontinuous manner along the tab wire 40 in the x direction.

Then, with reference to FIGS. 11 and 12, a description will be made in detail regarding a process of bonding the tab wire 40 to the back surface 14. The tab wire 40 whose one end is bonded to the light-receiving surface 12 is bonded to the back surface 14 at the other end.

Figure 11:
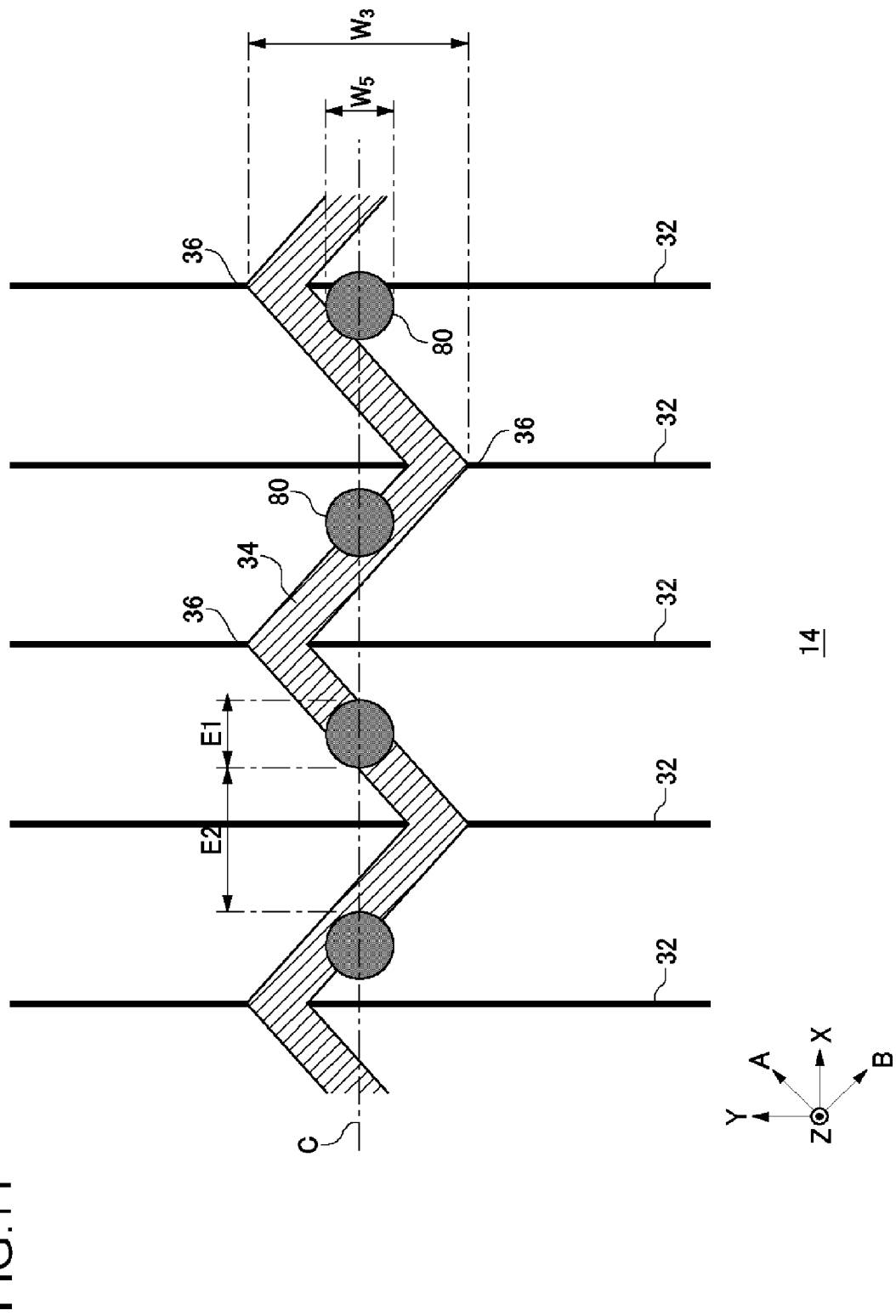
FIG. 11 is an exterior view illustrating the adhesive applied on back surface of the solar cell element according to the embodiment.

FIG. 11 is an exterior view illustrating an adhesive 80 that is applied on the back surface 14 of the solar cell element.

The adhesive 80 is applied on the back surface 14 in a discontinuous manner along the center line C of a bus bar electrode 34 extending in a zigzag shape. At this time, the vertices 36 are provided at positions that are spaced apart from the center line C. Thus, the adhesive 80 is applied at a position that is different from the vertices 36 and is provided at a position avoiding the vicinity of the vertices 36.

As in the case of the light-receiving surface 12, the adhesive 80 is applied in a discontinuous manner in the x direction using a discharge means 90 such as a dispenser. The adhesive 80 is applied only to an application area E1 that corresponds to an adhesion area D1 while avoiding a non-application area E2 that corresponds to a non-adhesion area D2. This allows the adhesive 80 to be applied such that the application area E1 and the non-application area E2 are arranged alternately in the x direction.

Figure 12:
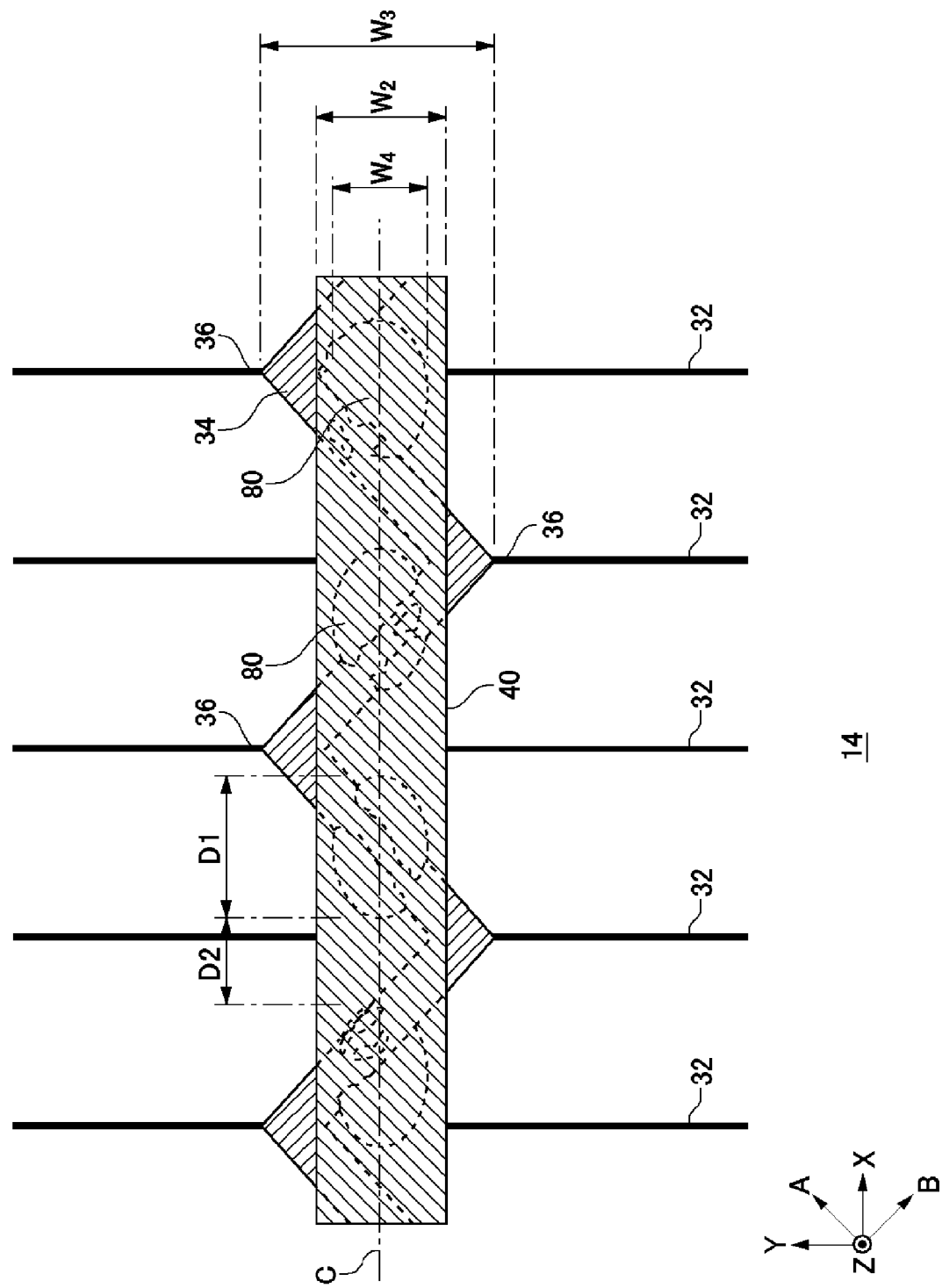
FIG. 12 is a diagram illustrating a tab wire that is bonded to the back surface of the solar cell element according to the embodiment.

FIG. 12 is a diagram illustrating a tab wire 40 that is bonded to the back surface 14 of the solar cell element.

The tab wire 40 is arranged on the adhesive 80 that is applied on the back surface 14, and the bus bar electrode 34 and the tab wire 40 are directly in contact with each other and become connected conductively. The pressing of the tab wire 40 makes the adhesive 80 to overflow around the bus bar electrode 34, and the back surface 14 and the tab wire 40 become bonded to each other by the adhesive 80 that has overflown. In other words, an area in which the adhesive 80 overflows is an adhesion area D1. On the other hand, an area in which the adhesive 80 does not spread and in which the tab wire 40 and the light-receiving surface 12 do not become bonded to each other is a non-adhesion area D2.

By thermally hardening the adhesive 80 by heating the tab wire 40 in this state, a second resin portion 54 is formed in the adhesion area D1. In this manner, the second resin portion 54 is provided in a discontinuous manner along the tab wire 40 in the x direction. Since the width $w_2$ of the tab wire 40 is narrower than a range $w_3$ of the bus bar electrode 34 that is formed in a zigzag shape, the vertices 36 of the bus bar electrode 34 stick out in the y direction from an area in which the tab wire 40 is provided.

The plurality of solar cell elements 70 to which the tab wire 40 is connected is sealed at the end. A resin sheet that constitutes a portion of the sealing layer 66 and the protection substrate 62 are arranged on the light-receiving surface 12 side of the plurality of solar cell elements 70 to which the tab wire 40 is connected, and a resin sheet that constitutes a portion of the sealing layer 66 and the back sheet 64 are arranged on the back surface 14 side. By thermocompression-bonding the solar cell elements 70 while the solar cell elements 70 are sandwiched between the protection substrate 62 and the back sheet 64, the resin sheet on the light-receiving surface 12 side and the resin sheet on the back surface 14 side are fused so as to form the sealing layer 66, and a solar cell module 100 is thus formed.

An explanation will be given in the following regarding effects achieved by the solar cell module 100 according to the present embodiment.

In the solar cell module 100 according to the present embodiment, the tab wire 40 and the light-receiving surface 12 are bonded to each other by the first resin portion 52 provided in a discontinuous manner on the light-receiving surface 12 of the solar cell elements 70. With this, stress that is applied to the solar cell elements 70 due to the provision of the resin portion can be mitigated compared to a case where resin portions that bond the light-receiving surface 12 and the tab wire 40 to each other are provided continuously in an area between the light-receiving surface 12 and the tab wire 40. In the same way, in the solar cell module 100, the tab wire 40 and the back surface 14 of the solar cell elements 70 are bonded to each other by the second resin portion 54 that is provided in a discontinuous manner on the back surface 14. Thus, stress applied on the back surface 14 side can also be mitigated. The mitigation of the stress applied to the solar cell elements 70 prevents the tab wire 40 from peeling off and the solar cell elements 70 from being damaged. Thus, the reliability of the solar cell module 100 can be increased.

Further, since the first resin portion 52 is provided in a discontinuous manner on the light-receiving surface 12 in the solar cell module 100, an area in which the resin portion is provided can be reduced compared to a case where resin portions that bond the light-receiving surface 12 and the tab wire 40 to each other are provided continuously in an area between the light-receiving surface 12 and the tab wire 40. Therefore, even when the resin portion is provided while overflowing to the outside of the tab wire 40, an area in which the light-receiving surface 12 is blocked by the resin portion can be reduced. Therefore, a decrease in the efficiency of the generation of electricity of the solar cell module 100 can be prevented.

Described above is an explanation of the present invention based on the embodiments. These embodiments are intended to be illustrative only, and it will be obvious to those skilled in the art that various modifications to constituting elements and processes could be developed and that such modifications are also within the scope of the present invention.

In the above-stated embodiment, the adhesive 80 is provided regardless of the arrangement of the finger electrodes, as shown in FIGS. 9 and 11. However, the adhesive 80 may be provided at intersection points of finger electrodes and a bus bar electrode.

Figure 13:
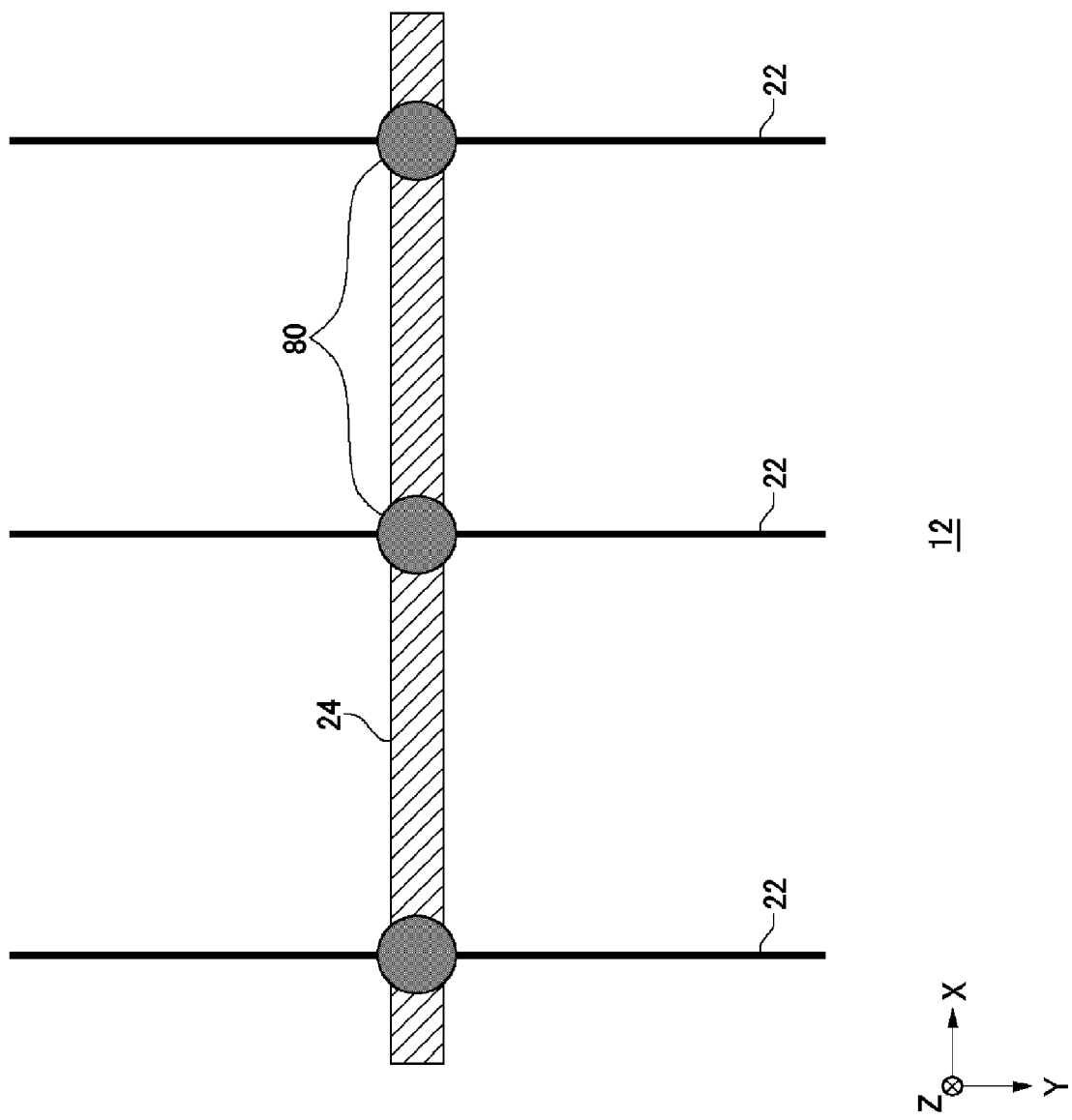
FIG. 13 is an exterior view illustrating an adhesive applied on a light-receiving surface of a solar cell element according to an exemplary variation.

FIG. 13 is an exterior view illustrating an adhesive 80 applied on a light-receiving surface 12 of a solar cell element according to a first exemplary variation. An adhesive 80 is applied at intersection points of a bus bar electrode 24 and finger electrodes 22 on the light-receiving surface 12 in the first exemplary variation. Since the finger electrodes 22 are provided at predetermined intervals, the adhesive 80 can be applied in a discontinuous manner by applying the adhesive 80 at the respective intersection points of the finger electrodes 22 and the bus bar electrode 24. Also, by applying the adhesive 80 at the respective positions at which the finger electrodes 22 are provided, the bonding strength of the tab wire 40 at the respective positions of the finger electrodes 22 can be increased.

Figure 14:
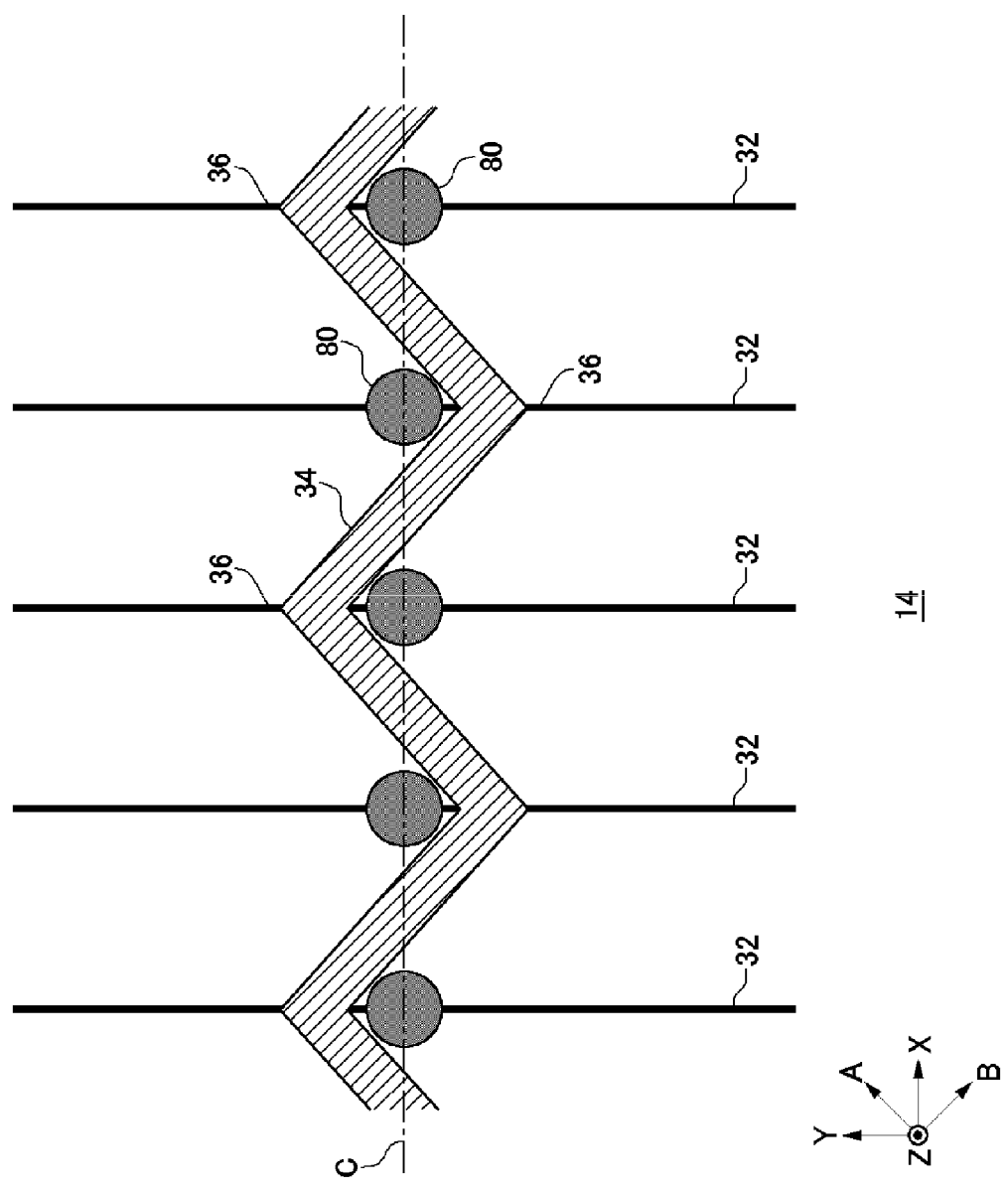
FIG. 14 is an exterior view illustrating an adhesive applied on a back surface of the solar cell element according to the exemplary variation.

FIG. 14 is an exterior view illustrating an adhesive 80 applied on a back surface 14 of the solar cell element according to the first exemplary variation. On the back surface 14 in the first exemplary variation, an adhesive 80 is applied at intersection points of a center line C of a bus bar electrode 34 and finger electrodes 32. The vertices 36 of the bus bar electrode 34 are also provided at respective positions that are spaced apart from the center line C in this case. Thus, the adhesive 80 is provided while avoiding the vicinity of the vertices 36. Thereby, the bonding strength of the tab wire 40 at the respective positions of the finger electrodes 32 can be increased.

As another exemplary variation, an adhesive 80 may be provided at a position avoiding an intersection point of a finger electrode and a bus bar electrode and may be provided, for example, at an intermediate position between finger electrodes that are adjacent to each other.

Figure 15:
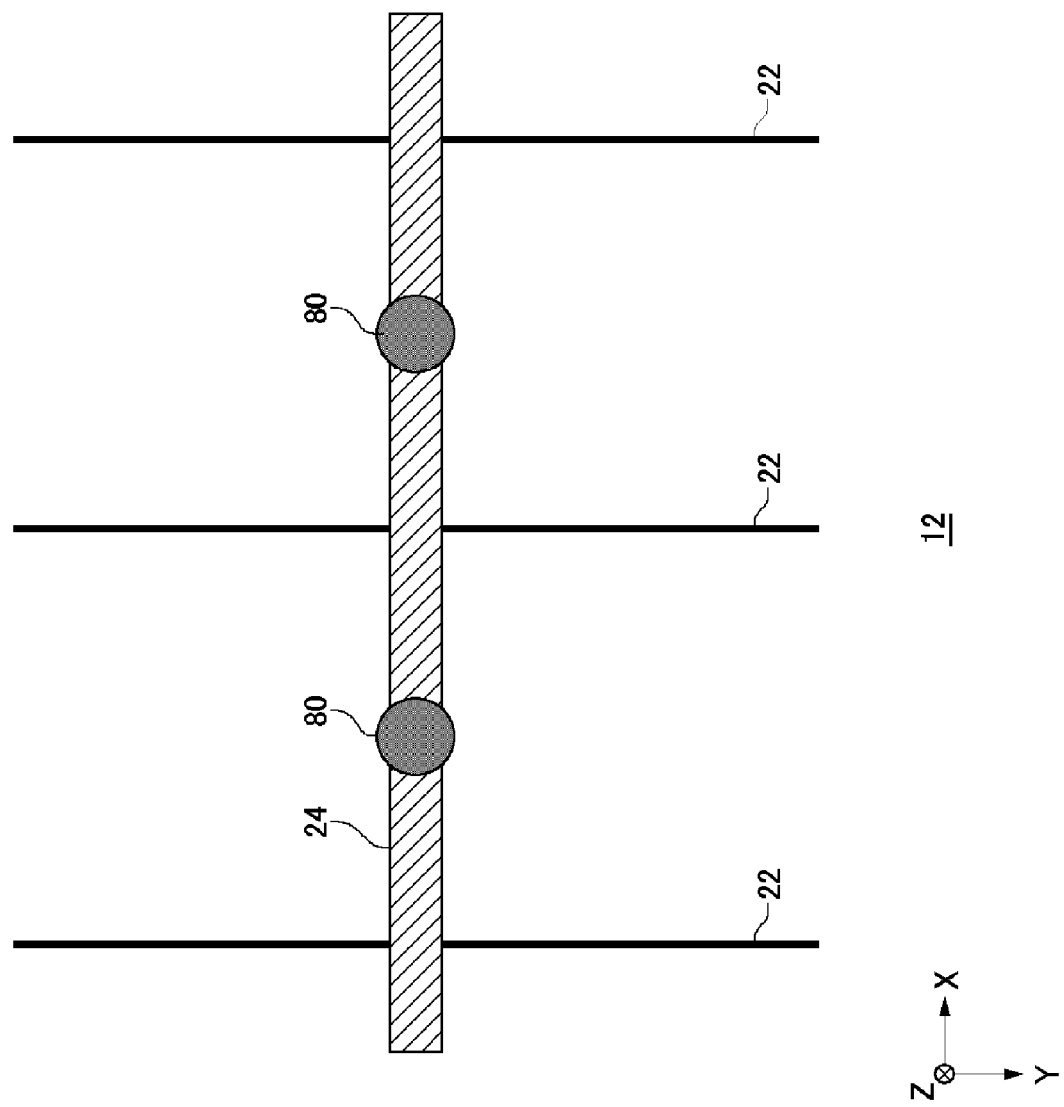
FIG. 15 is an exterior view illustrating an adhesive applied on a light-receiving surface of a solar cell element according to an exemplary variation.

FIG. 15 is an exterior view illustrating an adhesive 80 applied on a light-receiving surface 12 of a solar cell element according to a second exemplary variation. While avoiding an intersection point of a bus bar electrode 24 and finger electrodes 22, an adhesive 80 is applied at an intermediate position between intersection points that are adjacent to each other on the light-receiving surface 12 in the second exemplary variation. This allows a position at which stress from the finger electrodes 22 is applied and a position at which stress from a first resin portion 52 is applied to be different. Thus, the stress applied to the solar cell element can be dispersed.

Figure 16:
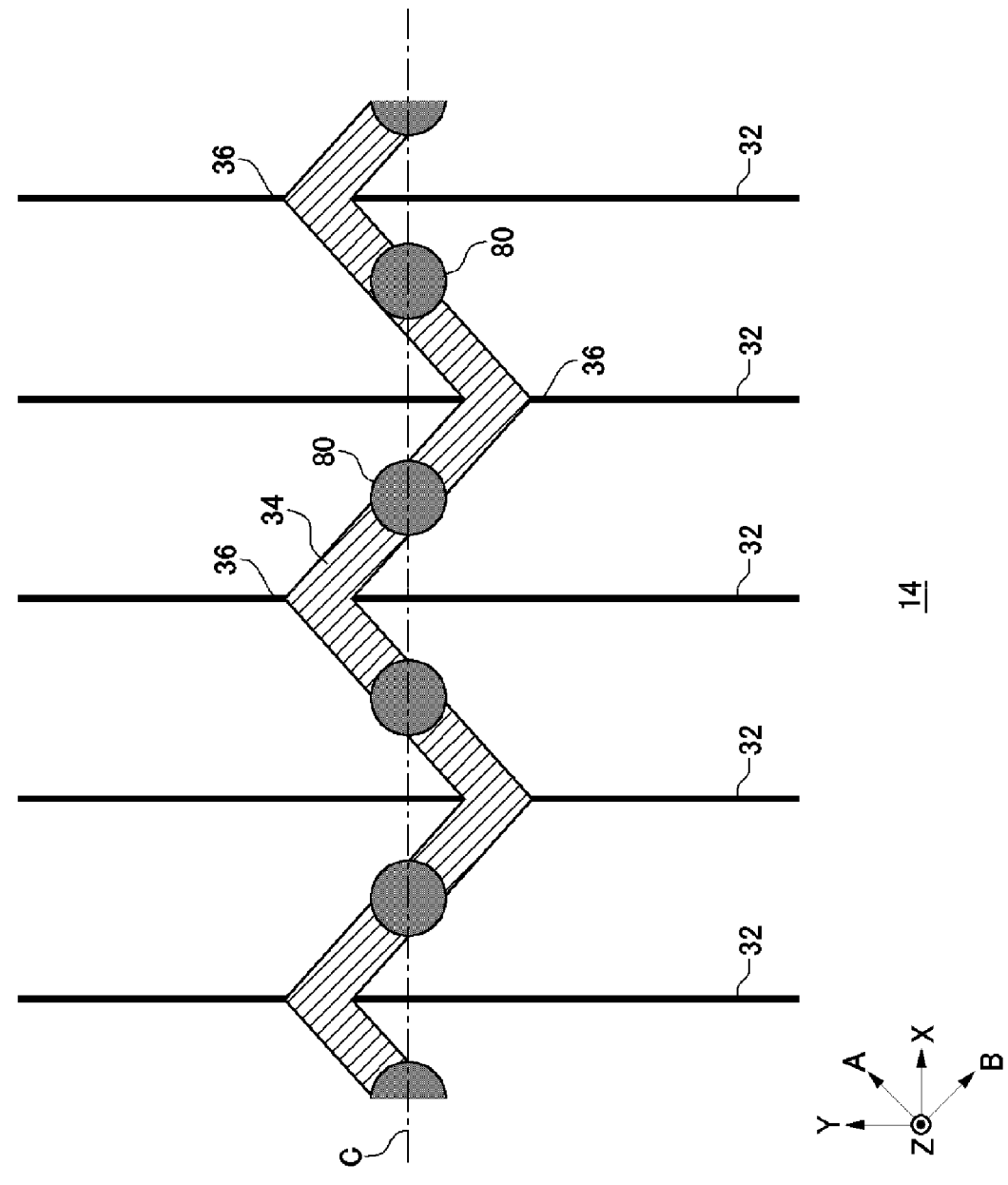
FIG. 16 is an exterior view illustrating an adhesive applied on a back surface of the solar cell element according to the exemplary variation.

FIG. 16 is an exterior view illustrating an adhesive 80 applied on a back surface 14 of the solar cell element according to the second exemplary variation. While avoiding an intersection point of a center line C of a bus bar electrode 34 and finger electrodes 32, an adhesive 80 is applied at an intermediate position between intersection points that are adjacent to each other on the back surface 14 in the second exemplary variation. In this case, the adhesive 80 is also provided while avoiding the vicinity of vertices 36. This allows a position at which stress from the finger electrodes 32 is applied and a position at which stress from a second resin portion 54 is applied to be different. Thus, the stress applied to the solar cell element can be dispersed.

In the above-described embodiment, the bus bar electrodes are provided on the light-receiving surface 12 and the back surface 14, and the bus bar electrodes and the tab wire 40 are directly in contact with each other and become connected conductively. In an exemplary variation, without providing bus bar electrodes on a light-receiving surface 12 and a back surface 14, a tab wire 40 may be bonded to the light-receiving surface 12 and the back surface 14 such that finger electrodes and the tab wire 40 are directly in contact with each other, and the tab wire 40 and the finger electrodes may become connected conductively. Either one of the light-receiving surface 12 and the back surface 14 may have a configuration without a bus bar electrode, and, on a surface on which a bus bar electrode is not provided, the tab wire 40 may be bonded to the surface such that the finger electrodes and the tab wire 40 are directly in contact with each other.

Figure 17:
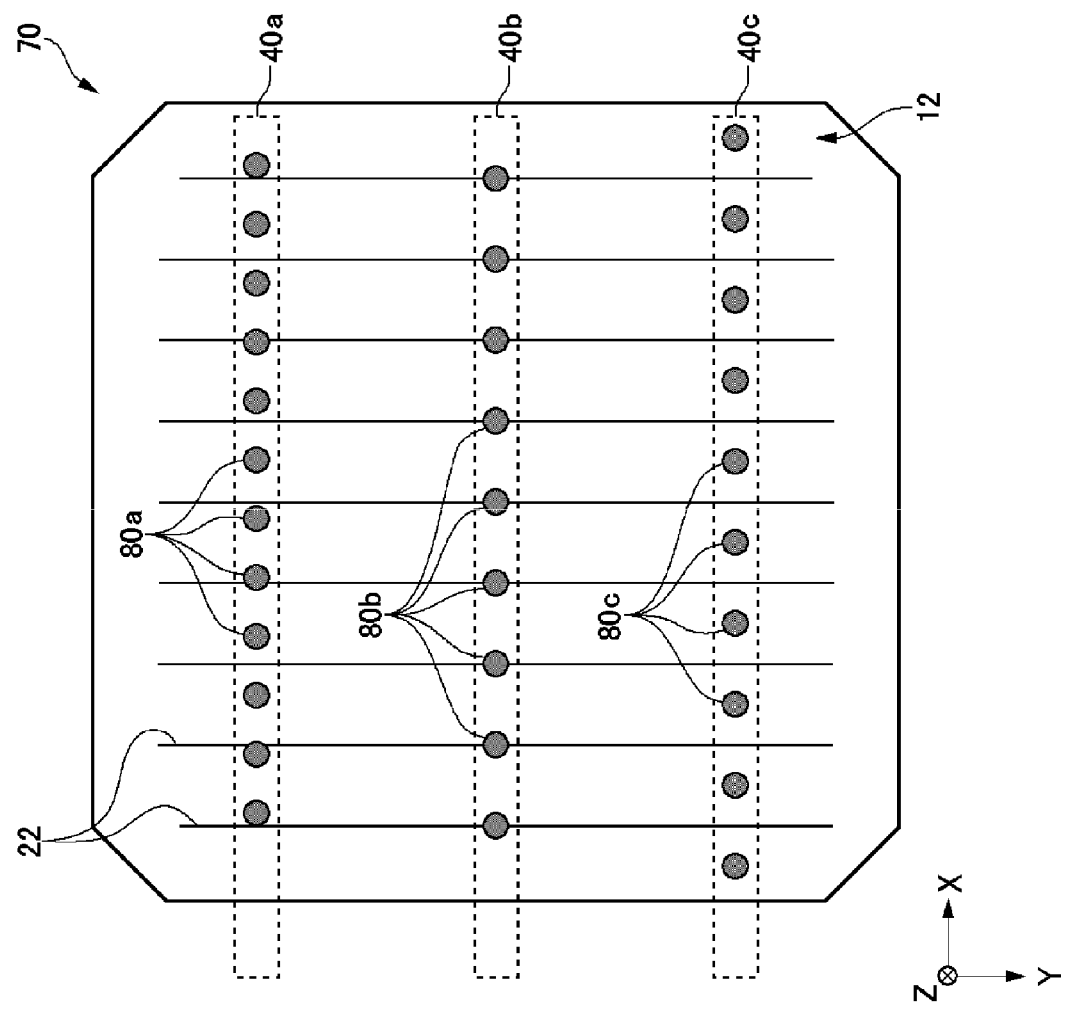
FIG. 17 is an exterior view illustrating an adhesive applied on a light-receiving surface of a solar cell element according to an exemplary variation.

FIG. 17 is an exterior view illustrating an adhesive 80 applied on a light-receiving surface 12 of a solar cell element 70 according to the third exemplary variation. In either cases of tab wires 40 (40a, 40b, and 40c), a first resin portion 52 is formed by applying the adhesive 80 (80a, 80b, and 80c) in a discontinuous manner along an area in which a tab wire 40 is bonded and bonding the tab wire 40 on the adhesive 80 that is applied.

The tab wire 40a shows a case where the adhesive 80a is applied in a discontinuous manner regardless of the position of finger electrodes 22. In the figure, intervals at which the adhesive 80a is discontinuously arranged are set to be narrower than intervals at which the finger electrodes 22 are arranged. Therefore, the position of the finger electrodes 22 does not correspond to the position of the adhesive 80a. In this case, stress that is applied to the solar cell element due to the provision of a resin portion can be mitigated compared to a case where the adhesive 80 is continuously applied in the x direction.

The tab wire 40b shows a case where the adhesive 80b is applied on the finger electrodes 22. In the figure, the intervals of the finger electrodes 22 and the intervals at which the adhesive 80b is discontinuously arranged are set to be equal to each other, and the position of the finger electrodes 22 in the x direction corresponds to the position of the adhesive 80b in the x direction so that the positions match each other. In this case, the strength of bonding with the tab wire 40b at the position where the finger electrodes 22 are provided can be increased.

The tab wire 40c shows a case where the adhesive 80c is applied avoiding the position of the finger electrodes 22. In the figure, the intervals of the finger electrodes 22 and the intervals at which the adhesive 80c is discontinuously arranged are set to be equal to each other, and the position of the finger electrodes 22 in the x direction and the position of the adhesive 80c in the x direction are shifted from each other such that the positions are different from each other. In this case, a position at which stress from the finger electrodes 22 is applied and a position at which stress from a first resin portion 52 is applied can be different. Thus, the stress applied to the solar cell element can be dispersed.

In the above-described embodiment, a positional relationship between the position of the first resin portion 52 provided on the light-receiving surface 12 and the position of the second resin portion 54 provided on the back surface 14 is not particularly defined. However, the positions may have a correspondence relationship.

Figure 18:
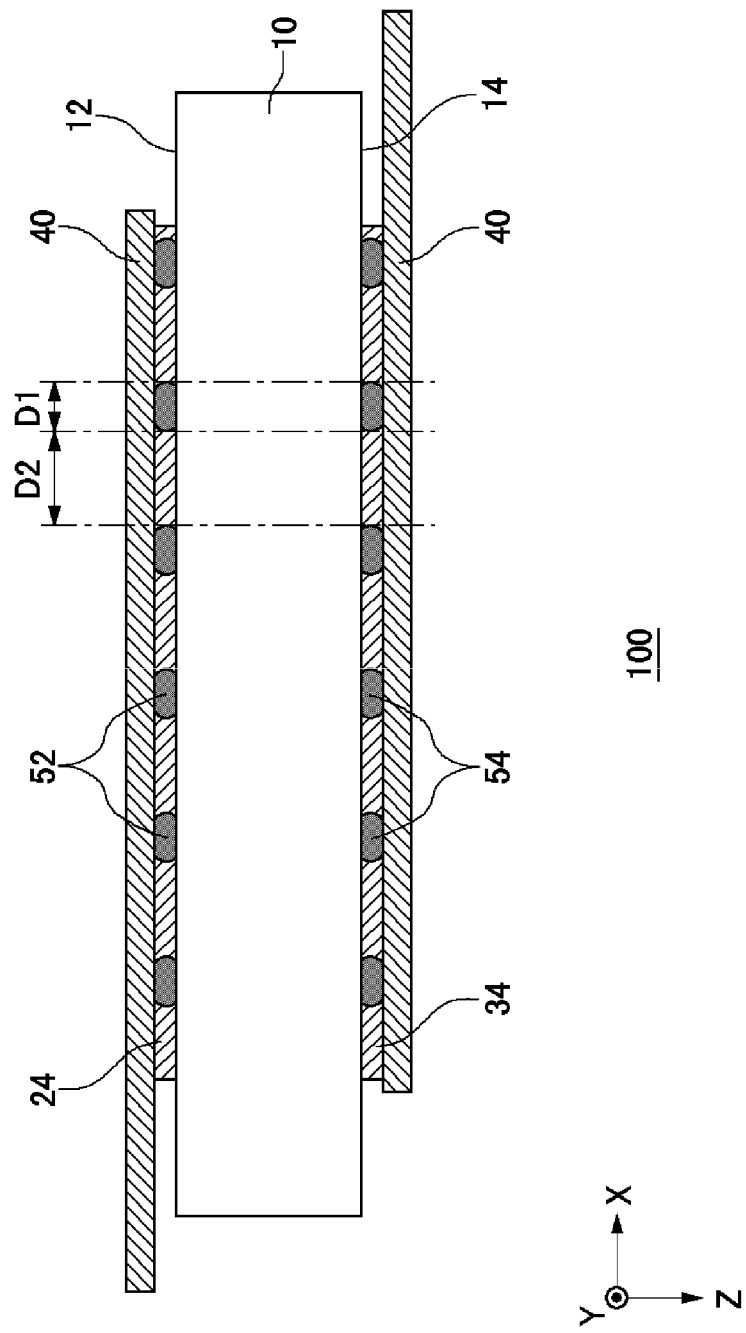
FIG. 18 is a cross-sectional view illustrating a solar cell module according to an exemplary variation.

FIG. 18 is a cross-sectional view illustrating a solar cell module 100 according to a fourth exemplary variation. A second resin portion 54 in the fourth exemplary variation is provided at a position that corresponds to an adhesion area D1 in which a first resin portion 52 is provided. The position that corresponds to the adhesion area D1 is an area on a back surface 14 that is opposed, at the back, to the position at which the first resin portion 52 is provided on the light-receiving surface 12 and is an adhesion area D1 whose position in the x direction in which a tab wire 40 extends is the same. By arranging the second resin portion 54 at the position that corresponds to the position at which the first resin portion 52 is provided, a spot at which stress is concentrated in the light-receiving surface 12 and a spot at which stress is concentrated in the back surface 14 can be aligned. This allows the reliability of the solar cell module 100 to be increased.

Figure 19:
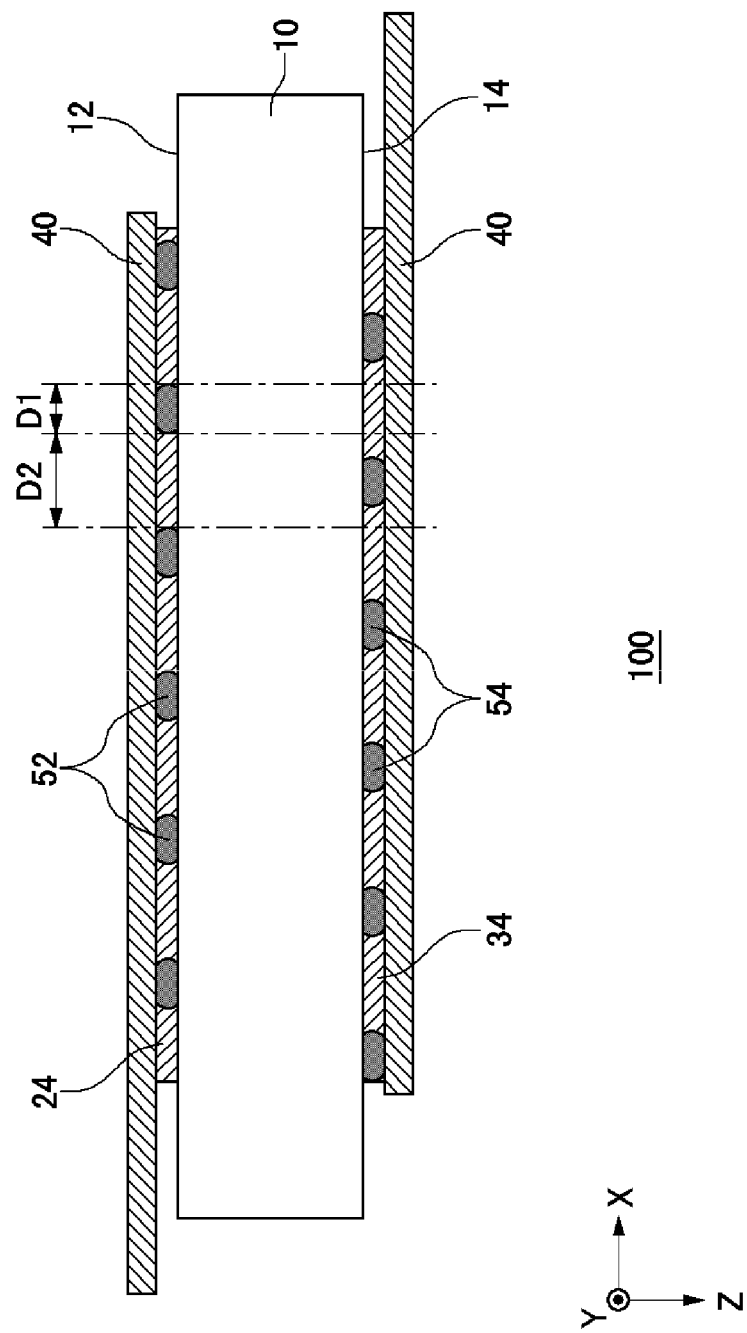
FIG. 19 is an exterior view illustrating a solar cell module according to an exemplary variation.

FIG. 19 is a cross-sectional view illustrating a solar cell module 100 according to a fifth exemplary variation. A second resin portion 54 in the fifth exemplary variation is provided at a position that corresponds to a position different from an adhesion area D1 in which a first resin portion 52 is provided. Therefore, the second resin portion 54 is not provided at a position where the second resin portion 54 is opposed, at the back, to the position at which the first resin portion 52 is provided and is arranged avoiding the position. In other words, the second resin portion 54 is provided at a position that corresponds to a non-adhesion area D2 in which the first resin portion 52 is not provided. By shifting the position at which the first resin portion 52 is provided and the position at which the second resin portion 54 is provided from each other, spots at which stress is concentrated can be dispersed in the light-receiving surface 12 and in the back surface 14. This allows the reliability of the solar cell module 100 to be increased.

In the above-described embodiment, a case is shown where the bus bar electrodes 24 having a linear shape are provided on the light-receiving surface 12 and the bus bar electrodes 34 having a zigzag shape are provided on the back surface 14. However, whether the bus bar electrodes provided on the respective surfaces have a linear shape or a zigzag shape does not matter. For example, both the light-receiving surface 12 and the back surface 14 may have bus bar electrode having a linear shape. Alternatively, the both surfaces may have bus bar electrodes having a zigzag shape. Also, contrary to the embodiment, bus bar electrodes having a zigzag shape may be provided on the light-receiving surface 12, and bus bar electrodes having a linear shape may be provided on the back surface 14. Further, either one of the light-receiving surface 12 and the back surface 14 may have a configuration without a bus bar electrode. Alternatively, the both surfaces may have a configuration without a bus bar electrode.

In the above-described embodiment, a case is shown where the bus bar electrodes 34 having a zigzag shape are provided on the back surface 14. However, bus bar electrodes that extend in a wavy line shape may be used instead of the bus bar electrodes that extend in a zigzag shape. The bus bar electrodes that extend in a wavy line shape may have a shape, for example, where a waveform of a sine wave extends, and the direction in which the electrodes extend may be changed such that the vertices 36 are rounded.

In the above-described embodiment, the tab wire 40 is provided extending in the x direction that is perpendicular to the y direction in which the finger electrodes extend. In an exemplary variation, the tab wire 40 may be provided extending in a diagonal direction that intersects with both the x direction and the y direction, along the light-receiving surface 12 or the back surface 14.

While the foregoing has described what are considered to be the best mode and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

Priority is claimed to PCT International Patent Application Number PCT/JP2013/002126, filed on Mar. 28, 2013, the entire contents of which are hereby incorporated by reference.

What is claimed is:

1. A solar cell module comprising:
a plurality of solar cell elements that have electricity generation layers, including semiconductor materials and absorbing incident light so as to generate photovoltaic power, and electrodes made of conductive materials containing metals and provided on surfaces of the electricity generation layers;
a tab wire that connects the electrodes of the plurality of solar cell elements; and
a resin portion that is provided on surfaces of solar cell elements and that bonds the tab wire and the solar cell elements to each other, wherein:
an adhesion area and a non-adhesion area are alternately arranged on the surfaces of the solar cell elements along the tab wire,
in the adhesion area, the resin portion is provided between the tab wire and the surfaces of the solar cell elements around the electrodes, and
in the non-adhesion area, the resin portion is not provided between the tab wire and the surfaces of the solar cell elements around the electrodes and the tab wire is directly in contact with the electrodes.

2. The solar cell module according to claim 1,
wherein the electrodes each have a bus bar electrode having a non-linear shape,
wherein the bus bar electrode is provided such that the bus bar electrode passes a plurality of vertices that are each positioned spaced apart in a short-side direction of the bus bar electrode from a center position of the bus bar electrode in the short-side direction, and
wherein the resin portion is provided avoiding the vicinity of the vertices.

3. The solar cell module according to claim 1,
wherein the solar cell elements each include a light-receiving surface, which is one of the surfaces, and a back surface, which is one of the surfaces and is opposed to the light-receiving surface at the back, and
wherein the resin portion includes a first resin portion provided on the light-receiving surface and a second resin portion provided at a position that corresponds to a position at which the first resin portion is provided on the back surface.

4. The solar cell module according to claim 1,
wherein the solar cell elements each include a light-receiving surface, which is one of the surfaces, and a back surface, which is one of the surfaces and is opposed to the light-receiving surface at the back, and
wherein the resin portion includes a first resin portion provided on the light-receiving surface and a second resin portion provided at a position that corresponds to a position different from a position at which the first resin portion is provided on the back surface.

5. A solar cell module manufacturing method comprising:
preparing a plurality of solar cell elements that have electricity generation layers, including semiconductor materials and absorbing incident light so as to generate photovoltaic power, and electrodes made of conductive materials containing metals and provided on surfaces of the electricity generation layers, and a tab wire that connects the plurality of solar cell elements with one another;
arranging an adhesive at predetermined intervals on the surfaces of the solar cell elements; and
arranging the tab wire on the adhesive so as to provide an adhesion area and a non-adhesion area that are alternately arranged along the tab wire, wherein:
in the adhesion area, the resin portion is provided between the tab wire and the surfaces of the solar cell elements around the electrodes, and
in the non-adhesion area, the resin portion is not provided between the tab wire and the surfaces of the solar cell elements around the electrodes and the tab wire is directly in contact with the electrodes.

* * * * *